US008462960B2

(12) United States Patent
Huang et al.

(10) Patent No.: US 8,462,960 B2
(45) Date of Patent: Jun. 11, 2013

(54) SIGNAL PROCESSING SYSTEM HAVING A PLURALITY OF HIGH-VOLTAGE FUNCTIONAL BLOCKS INTEGRATED INTO INTERFACE MODULE AND METHOD THEREOF

(75) Inventors: Sheng-Jui Huang, Hsinchu (TW); Yung-Yu Lin, Taipei (TW); Jen-Che Tsai, Taichung County (TW); Tzueng-Yau Lin, Taichung County (TW); Yau-Wai Wong, Hsinchu County (TW); Chih-Horng Weng, Hsinchu (TW); Chi-Hui Wang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 1049 days.

(21) Appl. No.: 12/128,607

(22) Filed: May 28, 2008

(65) Prior Publication Data

US 2009/0296950 A1 Dec. 3, 2009

(51) Int. Cl.
*H03F 3/217* (2006.01)

(52) U.S. Cl.
USPC .............................................. 381/74; 330/251

(58) Field of Classification Search
USPC .......................................................... 381/309
See application file for complete search history.

(56) References Cited

U.S. PATENT DOCUMENTS

| | | | | |
|---|---|---|---|---|
| 4,959,828 | A * | 9/1990 | Austin | 398/103 |
| 5,852,370 | A | 12/1998 | Ko | |
| 6,246,774 | B1 * | 6/2001 | Norris et al. | 381/104 |
| 6,545,525 | B2 | 4/2003 | Itoh | |
| 2007/0291929 | A1 | 12/2007 | Apfel | |

FOREIGN PATENT DOCUMENTS

| | | |
|---|---|---|
| CN | 101169963 A | 4/2008 |
| JP | 3142385 | 6/1991 |

* cited by examiner

*Primary Examiner* — David Vu
*Assistant Examiner* — Jonathan Han
(74) *Attorney, Agent, or Firm* — Winston Hsu; Scott Margo

(57) ABSTRACT

A signal processing system and related method are disclosed. The signal processing system includes a signal processing module, powered by a low supply voltage, for processing signals; and an interface module, coupled to the signal processing module, powered by a high supply voltage, for outputting signals generated from the signal processing module; wherein the interface module comprises a plurality of high-voltage functional blocks integrated therein, and each of the functional blocks is configured to perform a predetermined interface functionality. In this way, the bill-of-material (BOM) cost can be reduced.

24 Claims, 2 Drawing Sheets

SIGNAL PROCESSING SYSTEM HAVING A PLURALITY OF HIGH-VOLTAGE FUNCTIONAL BLOCKS INTEGRATED INTO INTERFACE MODULE AND METHOD THEREOF

BACKGROUND OF THE INVENTION

The present invention relates to a signal processing system, and more particularly, to a signal processing system having an interface module into which a plurality of high-voltage functional blocks is integrated and each of the functional blocks is configured to perform a predetermined interface functionality.

For audio systems, such as DVD players or televisions, a digital-to-analog converter (DAC) in the audio system is usually configured to deliver signals of 2V Vrms (i.e. 5.65V Vpp), so a high supply power voltage such as 9V or 12V is required; however, it is impossible to integrate the whole DAC inside a system on chip (SOC) as the maximum power supply voltage is lower than 3.3V for sub micron processes. Therefore, stand-alone buffers are needed. In addition, there are usually multiple input signals for an analog-to-digital converter (ADC), so an M-to-1 multiplexer (MUX) is commonly needed for the ADC. If the whole M-to-1 MUX is integrated inside the SOC, the SOC has to supply 2*M pins for the M-to-1 MUX. For example, if the MUX integrated inside the SOC is a 7-to-1 MUX, the SOC needs to supply a total of 14 dedicated I/O pins. However, it is not preferable to integrate the whole ADC inside the SOC since pin counts are limited and precious. Therefore, a stand-alone MUX such as a low-THD MUX is needed.

Please refer to FIG. 1. FIG. 1 is an exemplary diagram illustrating a typical audio system 100. As shown in FIG. 1, the typical audio system includes an SOC 110, an audio codec 120, a stand-alone buffer 130, and a stand-alone MUX 140. The audio codec 120 is coupled to the SOC 110 via an I2S interface, and has a DAC 122 and an ADC 124 implemented therein. The stand-alone buffer 130 is coupled to the DAC 122, and the power supply voltage of the stand-alone buffer 130 is 9V or 12V rather than 3.3V supplied to the SOC 110 and the codec 120. As shown in FIG. 1, the stand-alone MUX 140 is coupled to the ADC 124 for outputting a selected input to the ADC 124. In this case where the components are implemented in the audio system individually without proper integration, the stand-alone components such as the buffer 130 and the MUX 140 cause an extra bill-of-material (BOM) cost and significantly increase the production cost.

SUMMARY OF THE INVENTION

It is therefore one of the objectives of the present invention to provide a signal processing system and related method to integrate a plurality of high-voltage functional blocks into a single chip, to solve the above-mentioned problem.

According to an exemplary embodiment of the claimed invention, a signal processing system is disclosed. The signal processing system comprises a signal processing module and an interface module. The signal processing module is powered by a low supply voltage, and is for processing signals. The interface module is powered by a high supply voltage, and is for outputting signals generated from the signal processing module, wherein the interface module comprises a plurality of high-voltage functional blocks integrated therein, and each of the functional blocks is configured to perform a predetermined interface functionality.

According to an exemplary embodiment of the claimed invention, a signal processing method is disclosed. The method comprises: powering a signal processing module by a low supply voltage for processing signals; integrating a plurality of high-voltage functional blocks into an interface module; and powering the interface module by a high supply voltage for outputting signals generated from the signal processing module, wherein each of the functional blocks is configured to perform a predetermined interface functionality.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
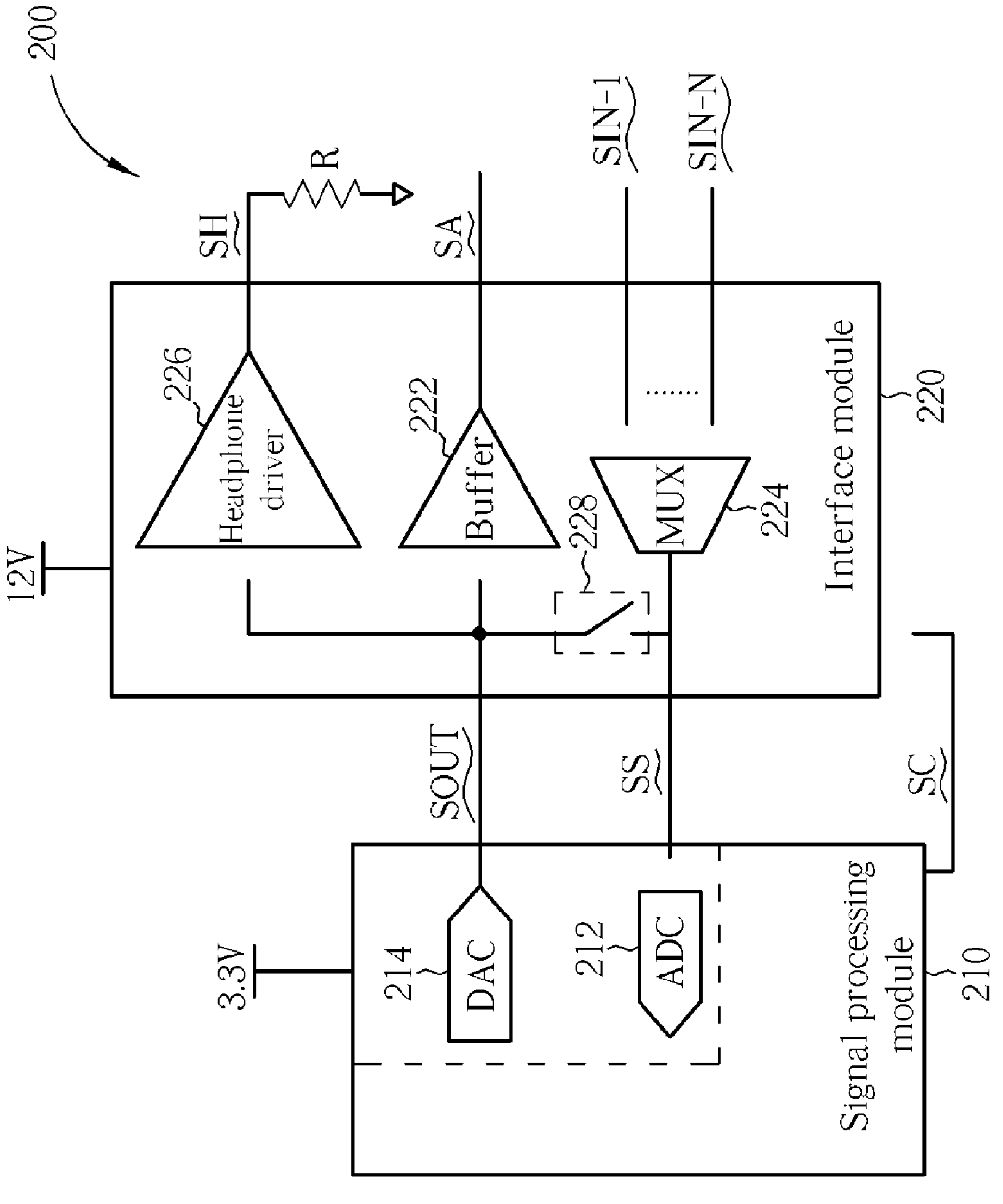
FIG. 2 is a block diagram illustrating a signal processing system according to an embodiment of the present invention.

Please refer to FIG. 2. FIG. 2 is a block diagram illustrating a signal processing system 200 according to an embodiment of the present invention. The signal processing system 200 comprises a signal processing module 210 and an interface module 220 coupled to the signal processing module 210. The signal processing module 210 is powered by a low supply voltage, and is used for processing incoming signals. The interface module 220 is powered by a high supply voltage, and is used for outputting signals generated from the signal processing module 210. The interface module 220 has a plurality of high-voltage functional blocks integrated therein, and each of the functional blocks is configured to perform a predetermined interface functionality. In this embodiment, the signal processing module 210 may be an audio processing module such as a system on chip (SOC) dedicated to processing audio signals, however, the signal processing module 210 may be dedicated to processing any other type of signals. The signal processing module 210 is powered by a low supply voltage, such as 3.3V, while the interface module 220 is powered by a high supply voltage, such as 12V; however, these exemplary voltage settings for high supply voltage and low supply voltage are for illustrative purposes only and are not meant to be limitations of the present invention. As shown in FIG. 2, the interface module 220 has three high-voltage functional blocks, a buffer 222, a multiplexer 224 and a headphone driver 226. The buffer 222, multiplexer 224 and the headphone driver 226 are all coupled to the signal processing module 210. The multiplexer 224 is used for receiving a plurality of input signals SIN_1-SIN_N and outputting a selected signal SS to the signal processing module 210 for further signal processing, wherein the selected signal SS is determined according to a control signal SC received from the signal processing module 210, but is not limited to this configuration. The buffer 222 is used for driving an output signal SOUT generated from the signal processing module 210 in order to generate an amplified output signal SA whose swing voltage is around 5.65V required for properly driving the following load (not shown). The headphone driver 226 is further coupled to a load resistor R of 8 or 16 ohms, and is also used for driving the output signal SOUT generated from the signal processing module 210 in order to generate a headphone output signal SH required for driving a headphone device connected thereto. Additionally, the interface module 220 further has a switch 228 acting as a bypass path if switched on. The switch 228 couples the multiplexer 224 to the buffer 222 and the headphone driver 216, and is used for selectively bypassing the selected signal SS from the multiplexer 224 to the buffer 222 or the headphone driver 226; however, the switch 228 in this exemplary embodiment is an optional component, depending upon design requirements.

Briefly summarized, due to integrating the buffer 222, the multiplexer 224 and the headphone driver 226 or any other high-voltage functional blocks together into the single interface module 220, the bill-of-material (BOM) cost can be decreased greatly. Additionally, the circuit size is reduced due to improved integration. It can be clearly seen that the more high-voltage functional blocks are integrated into the interface module 220, the more the BOM cost can be saved. In addition, owing to the multiplexer 224 being integrated into the interface module 220, the important I/O pins of the signal processing module 210 (e.g. SOC) can be saved considerably. Please note that the above-mentioned embodiment is merely for illustrative purposes, and is not meant to be a limitation of the present invention. In other embodiments, all the high-voltage functional blocks dedicated to the signal processing module 210 can be integrated into the interface module 220 in order to further decrease the BOM cost. The high-voltage functional blocks integrated into the interface module 220 may comprise a buffer, a multiplexer, a headphone driver, a regulator or any combinations thereof.

Figure 1:
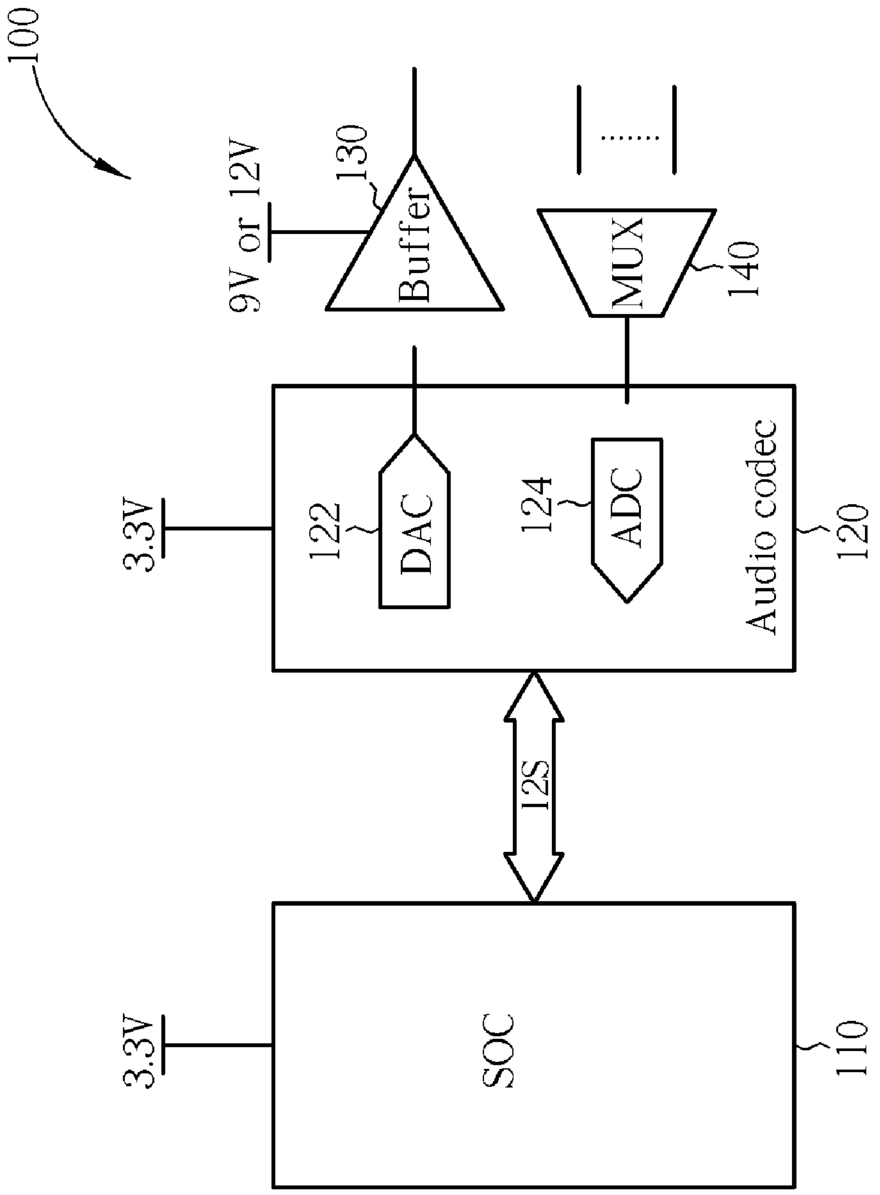
Fig. 1 Related Art
FIG. 1 is an exemplary diagram illustrating a typical audio system.

Please refer to FIG. 2 again. The signal processing module 210 has an analog-to-digital converter (ADC) 212 and a digital-to-analog converter (DAC) 214 implemented therein. The ADC 212 is coupled to the multiplexer 224, and is used for receiving the selected signal SS from the multiplexer 224 to allow the selected signal SS to be processed properly by following digital signal processing components (not shown) in the signal processing module 210. The DAC 214 is coupled to the buffer 222, and is used for outputting the output signal generated from the digital signal processing components (not shown) in the signal processing module 210 to the buffer 222 or the headphone driver 226. Compared to the conventional audio system shown in FIG. 1, since the ADC 212 and the DAC 214 are both integrated into the signal processing module 210 (e.g. an SOC), the circuit area occupied by digital circuit components can be greatly reduced. As for analog circuit components such as a sigma delta modulator, although the wafer in the advanced process is more expensive, the circuit area occupied by analog circuit components can also be reduced because of fewer design constraints, so the production cost will not increase. It should be noted that in other embodiments where the signal processing module 210 is a module configured to process digital signals directly, the ADC 212 and the DAC 214 can be omitted. In other words, the ADC 212 and the DAC 214 are optional components, depending upon design requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing system, comprising:

a signal processing module, powered by a low supply voltage, for processing signals; and an interface module, coupled to the signal processing module, powered by a high supply voltage, for outputting signals generated from the signal processing module, and for outputting a selected signal to the signal processing module;

wherein the interface module comprises a plurality of high-voltage functional blocks integrated therein, and each of the functional blocks is configured to perform a predetermined interface functionality, and a voltage level of the high supply voltage is higher than a voltage level of the low supply voltage.

2. The signal processing system of claim 1, wherein any high-voltage functional blocks dedicated to the signal processing module are integrated in the interface module.

3. The signal processing system of claim 1, wherein the signal processing module is an audio processing module dedicated to processing audio signals.

4. The signal processing system of claim 3, wherein the plurality of high-voltage functional blocks comprise a buffer, coupled to the signal processing module, for driving an output signal generated from the signal processing module to generate an amplified output signal.

5. The signal processing system of claim 4, wherein the plurality of high-voltage functional blocks further comprise a multiplexer, coupled to the signal processing module, for receiving a plurality of input signals and outputting the selected signal to the signal processing module.

6. The signal processing system of claim 5, wherein the signal processing module comprises:

an analog-to-digital converter (ADC), coupled to the multiplexer, for receiving the selected signal from the multiplexer; and a digital-to-analog converter (DAC), coupled to the buffer, for outputting the output signal to the buffer.

7. The signal processing system of claim 5, wherein the interface module further comprises a switch coupled between the buffer and the multiplexer for selectively bypassing the selected signal to the buffer.

8. The signal processing system of claim 7, wherein the plurality of high-voltage functional blocks further comprise a headphone driver, coupled to the signal processing module and the switch, for driving the selected signal received from the multiplexer or the output signal received from the signal processing module to generate a headphone output signal.

9. The signal processing system of claim 4, wherein the plurality of high-voltage functional blocks further comprise a headphone driver, coupled to the signal processing module, for driving the output signal received from the signal processing module to generate a headphone output signal.

10. The signal processing system of claim 4, wherein the interface module further comprises a regulator.

11. The signal processing system of claim 3, wherein the plurality of high-voltage functional blocks comprise a multiplexer, coupled to the signal processing module, for receiving a plurality of input signals and outputting the selected signal to the signal processing module.

12. The signal processing system of claim 1, wherein the plurality of high-voltage functional blocks are integrated into a single chip.

13. A signal processing method, comprising:
- powering a signal processing module by a low supply voltage for processing signals;
- integrating a plurality of high-voltage functional blocks into an interface module; and
- powering the interface module by a high supply voltage for outputting signals generated from the signal processing module, and for outputting a selected signal to the signal processing module, wherein each of the functional blocks is configured to perform a predetermined interface functionality, and a voltage level of the high supply voltage is higher than a voltage level of the low supply voltage.

14. The method of claim 13, wherein the step of integrating the plurality of high-voltage functional blocks into the interface module integrates any high-voltage functional blocks dedicated to the signal processing module into the interface module.

15. The method of claim 13, wherein the signal processing module is an audio processing module dedicated to processing audio signals.

16. The method of claim 15, wherein the step of powering the interface module by the high supply voltage is further for driving an output signal generated from the signal processing module to generate an amplified output signal.

17. The method of claim 16, wherein the step of powering the interface module by the high supply voltage is further for receiving a plurality of input signals and outputting the selected signal to the signal processing module.

18. The method of claim 17, wherein the step of powering the signal processing module by the low supply voltage for processing signals is further for receiving the selected signal and outputting the output signal to the interface module.

19. The method of claim 17, wherein the step of powering the interface module by the high supply voltage is further for selectively bypassing the selected signal.

20. The method of claim 19, wherein the step of powering the interface module by the high supply voltage is further for driving the selected signal or the output signal received from the signal processing module to generate a headphone output signal.

21. The method of claim 16, wherein the step of powering the interface module by the high supply voltage is further for driving the output signal received from the signal processing module to generate a headphone output signal.

22. The method of claim 16, wherein the step of powering the interface module by the high supply voltage is further for stabilizing the supply voltage.

23. The method of claim 15, wherein the step of powering the signal processing module by the low supply voltage for processing signals is further for receiving the selected signal and outputting the output signal to the interface module.

24. The method of claim 13, wherein the plurality of high-voltage functional blocks are integrated into a single chip.

* * * * *